(12) United States Patent
Shin et al.

(10) Patent No.: US 11,735,427 B2
(45) Date of Patent: Aug. 22, 2023

(54) POLISHING APPARATUS INCLUDING POLISHING PAD CONDITIONER, NON-CONTACT DISPLACEMENT SENSOR, AND DATA PROCESSOR

(71) Applicant: Samsung Electronics Co., Ltd., Suwon-si (KR)

(72) Inventors: Jin Shin, Hwaseong-si (KR); Woo-Mok Son, Hwaseong-si (KR); Nam-Hoon Lee, Hwaseong-si (KR); Dong-Eog Kim, Suwon-si (KR); Seung-Hun Oh, Osan-si (KR); Eun-Seok Lee, Hwaseong-si (KR); Young-Seok Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/544,990

(22) Filed: Dec. 8, 2021

(65) Prior Publication Data
US 2022/0093405 A1    Mar. 24, 2022

Related U.S. Application Data

(63) Continuation of application No. 16/426,117, filed on May 30, 2019, now Pat. No. 11,222,786.

(30) Foreign Application Priority Data

Nov. 12, 2018  (KR) .......................... 10-2018-0137886

(51) Int. Cl.
*H01L 21/304*  (2006.01)
*H01L 21/02*  (2006.01)
(Continued)

(52) U.S. Cl.
CPC ...... *H01L 21/304* (2013.01); *H01L 21/02013* (2013.01); *H01L 22/12* (2013.01);
(Continued)

(58) Field of Classification Search
CPC . H01L 21/304; H01L 21/02013; H01L 22/12; H01L 21/30625; B24B 37/10;
(Continued)

(56) References Cited

U.S. PATENT DOCUMENTS 5,618,447 A     4/1997  Sandhu
5,851,845 A  *  12/1998  Wood ...................... H01L 24/32
                                                                      438/114

(Continued)

FOREIGN PATENT DOCUMENTS

CN      101905444 B    12/2010
CN      102240962 B    11/2011
(Continued)

*Primary Examiner* — Ermias T Woldegeorgis
(74) *Attorney, Agent, or Firm* — Muir Patent Law, PLLC

(57) ABSTRACT

In a method of manufacture, a displacement sensor is provided over a conditioner disk. The conditioner disk is rotated to perform a conditioning process on a polishing surface of a polishing pad. A displacement of the rotating conditioner disk is detected using the displacement sensor during the conditioning process. A height of the conditioner disk is calculated from the detected displacement. An end point of the conditioning process is determined on the polishing surface based on the calculated height.

15 Claims, 10 Drawing Sheets

(51) Int. Cl.
 *H01L 21/66* (2006.01)
 *B24B 37/10* (2012.01)
 *B24B 49/02* (2006.01)
 *B24B 37/013* (2012.01)
 *B24B 37/04* (2012.01)
 *B24B 49/10* (2006.01)

(52) U.S. Cl.
 CPC ............ *B24B 37/013* (2013.01); *B24B 37/042* (2013.01); *B24B 37/10* (2013.01); *B24B 49/02* (2013.01); *B24B 49/10* (2013.01)

(58) Field of Classification Search
 CPC ..... B24B 49/02; B24B 37/013; B24B 37/042; B24B 49/10; B24B 37/005; B24B 37/34; B24B 53/017; B24B 49/00; B24B 49/105; B24B 57/02
 See application file for complete search history.

(56) References Cited

U.S. PATENT DOCUMENTS

| | | |
|---|---|---|
| 7,078,894 B2 | 7/2006 | Tada et al. |
| 7,374,477 B2 | 5/2008 | Birang et al. |
| 7,714,572 B2 | 5/2010 | Tada et al. |
| 7,947,505 B2 | 5/2011 | Kawasaki et al. |
| 8,043,870 B2 | 10/2011 | Manens et al. |
| 8,296,961 B2 | 10/2012 | Nakayoshi et al. |
| 8,517,796 B2 | 8/2013 | Shinozaki |
| 8,662,956 B2 | 3/2014 | Seo et al. |
| 8,912,095 B2 | 12/2014 | Sano et al. |
| 9,281,253 B2 | 3/2016 | Xu et al. |
| 9,943,943 B2 | 4/2018 | Shinozaki et al. |
| 2004/0192168 A1 | 9/2004 | Faustmann et al. |
| 2008/0004743 A1* | 1/2008 | Goers ............... B24B 53/017 700/121 |
| 2012/0309267 A1* | 12/2012 | Shinozaki ............ B24B 37/042 451/8 |

FOREIGN PATENT DOCUMENTS

| | | | |
|---|---|---|---|
| CN | 103894883 A | 7/2014 | |
| CN | 205166654 U | 4/2016 | |
| CN | 106853609 B | 6/2017 | |
| JP | 20050342841 A | 12/2005 | |
| KR | 10-0838284 B1 | 6/2008 | |
| WO | WO-2006049269 A1 * | 5/2006 | ........... B24B 37/005 |

* cited by examiner

POLISHING APPARATUS INCLUDING POLISHING PAD CONDITIONER, NON-CONTACT DISPLACEMENT SENSOR, AND DATA PROCESSOR

PRIORITY STATEMENT

This application is a continuation application of U.S. patent application Ser. No. 16/426,117, filed May 30, 2019, which claims priority under 35 U.S.C. § 119 to Korean Patent Application No. 10-2018-0137886, filed on Nov. 12, 2018 in the Korean Intellectual Property Office (KIPO), the contents of each of which are herein incorporated by reference in their entirety.

BACKGROUND

1. Field

Example embodiments relate to a polishing pad monitoring method, a polishing pad monitoring apparatus, a polishing apparatus including the pad monitoring apparatus, and a method of manufacturing a semiconductor device using the polishing apparatus. More particularly, example embodiments relate to a polishing pad monitoring method of monitoring a conditioning process on a polishing pad and a polishing pad monitoring apparatus for performing the same.

2. Description of the Related Art

In a chemical mechanical polishing process, a conditioner disk may be rotated to condition a polishing surface of a polishing pad, to thereby maintain a polishing performance. In order to monitor the conditioning process on the polishing pad, it may be beneficial to obtain a profile of the polishing pad (e.g., a cross-sectional profile/shape of the polishing surface). However, because a movement of a conditioner disk is not monitored, a precise profile of the polishing pad may not be obtained, and thus, it may be difficult to precisely analyze the polishing pad conditioning process and to determine whether a polishing pad conditioner is in proper condition.

SUMMARY

Example embodiments provide a polishing pad monitoring method capable of obtaining a precise profile of a polishing pad, precisely analyzing a polishing pad conditioning process and diagnosing a failure in a polishing pad conditioner.

Example embodiments provide a polishing pad monitoring apparatus for performing the polishing pad monitoring method. Example embodiments also provides a method of manufacture semiconductor devices using the monitoring apparatus and/or the monitoring method.

According to example embodiments, in a method of manufacture, a displacement sensor is provided over a conditioner disk. The conditioner disk is rotated to perform a conditioning process on a polishing surface of a polishing pad. A displacement of the rotating conditioner disk is detected using the displacement sensor during the conditioning process. A height of the conditioner disk is calculated from the detected displacement. An end point of the conditioning process is determined on the polishing surface based on the calculated height.

According to example embodiments, in a method of manufacture, a conditioner disk is rotated to perform a conditioning process on a polishing surface of a polishing pad. A displacement of the rotating conditioner disk is detected using a non-contacting displacement sensor which is arranged to face an upper surface of the conditioner disk during the conditioning process. A height of the conditioner disk is calculated from the detected displacement. A height of the polishing pad or a failure of a polishing pad conditioner including the conditioner disk is determined based on the calculated height.

According to example embodiments, a polishing apparatus includes a polishing pad conditioner including a conditioner disk which is rotatable and configured to condition a polishing surface of a polishing pad, a non-contacting displacement sensor arranged to face an upper surface of the conditioner disk and configured to detect a displacement of the conditioner disk while the conditioner disk rotates, and a data processor configured to calculate a height of the conditioner disk from displacement detected by the non-contacting displacement sensor and configured to determine a height of the polishing pad or a failure of the polishing pad conditioner including the conditioner disk.

According to example embodiments, a displacement of a rotating conditioner disk may be detected using an eddy current sensor installed in a disk head, and a height of a polishing pad and a failure and replacement time of parts in a polishing pad conditioner may be determined.

Accordingly, since a precise profile of the polishing pad is obtained while a polishing pad conditioning process is performed, the polishing pad conditioning process may be analyzed precisely, and fault diagnosis for movement balance (sweep, rotation) maintenance of the conditioner disk may be performed easily.

BRIEF DESCRIPTION OF THE DRAWINGS

Example embodiments will be more clearly understood from the following detailed description taken in conjunction with the accompanying drawings.

FIG. 1 is a perspective view illustrating a chemical mechanical polishing apparatus in accordance with example embodiments.

FIG. 2 is a perspective view illustrating a polishing pad of the chemical mechanical polishing apparatus in FIG. 1.

FIG. 3 is a plan view illustrating a relative position between the polishing pad and a polishing pad conditioner of the chemical mechanical polishing apparatus in FIG. 1.

FIG. 4 is a block diagram illustrating a monitoring apparatus of the polishing pad in FIG. 2.

FIG. 5 is a side view illustrating the polishing pad conditioner and an eddy current sensor in FIG. 4.

FIG. 6 is a perspective view illustrating the polishing pad conditioner and the eddy current sensor in FIG. 4.

FIG. 7 is a perspective view illustrating the eddy current sensors installed in a disk head of the polishing pad conditioner in FIG. 6.

FIGS. 8 to 10 are perspective views in which indexing structures are provided in an upper surface of a disk of the polishing pad conditioner in accordance with example embodiments.

FIG. 11 is a perspective view illustrating a calibration jig used for data conversion in a polishing pad monitoring apparatus in accordance with example embodiments.

FIG. 12 is a graph illustrating a first calibration map for converting analog output data into two-dimensional plane profile data of a constant height by using the calibration jig in FIG. 11.

FIG. 13 is a second calibration map for converting analog output data into height data of two-dimensional plane by using the calibration jig in FIG. 11.

FIG. 14 is a flow chart illustrating a polishing pad monitoring method in accordance with example embodiments.

DETAILED DESCRIPTION OF EXAMPLE EMBODIMENTS

Hereinafter, example embodiments will be explained in detail with reference to the accompanying drawings.

Figure 1:
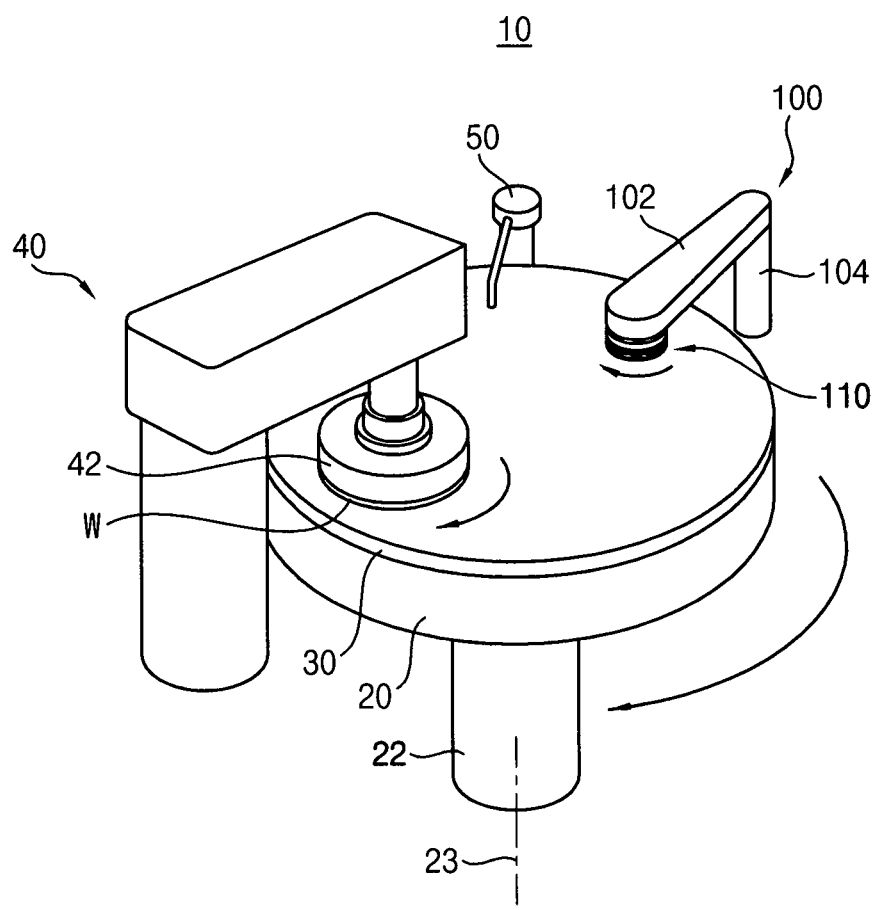
FIGS. 1 to 14 represent non-limiting, example embodiments as described herein.
Figure 2:
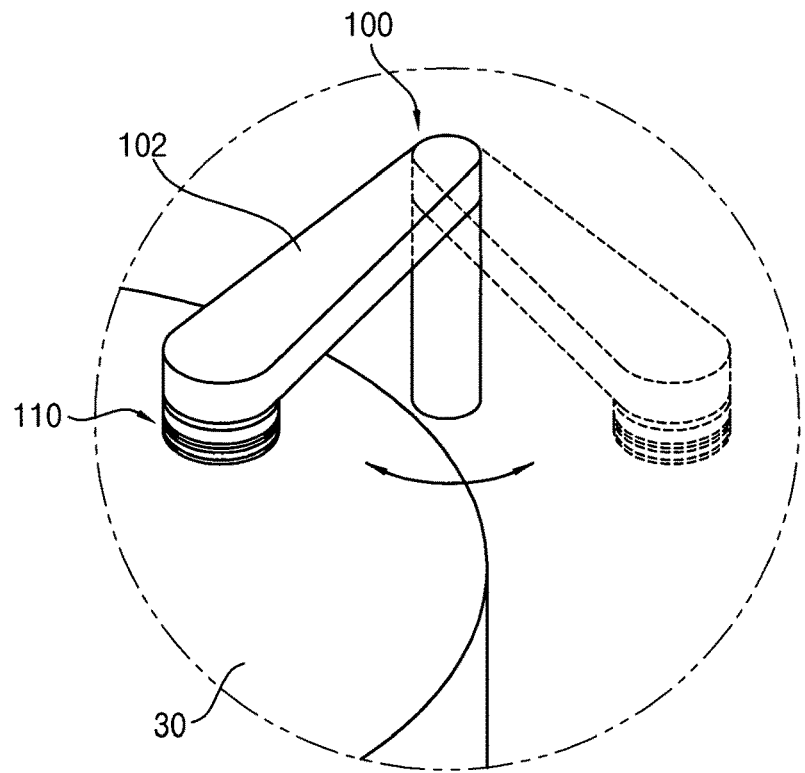
Figure 3:
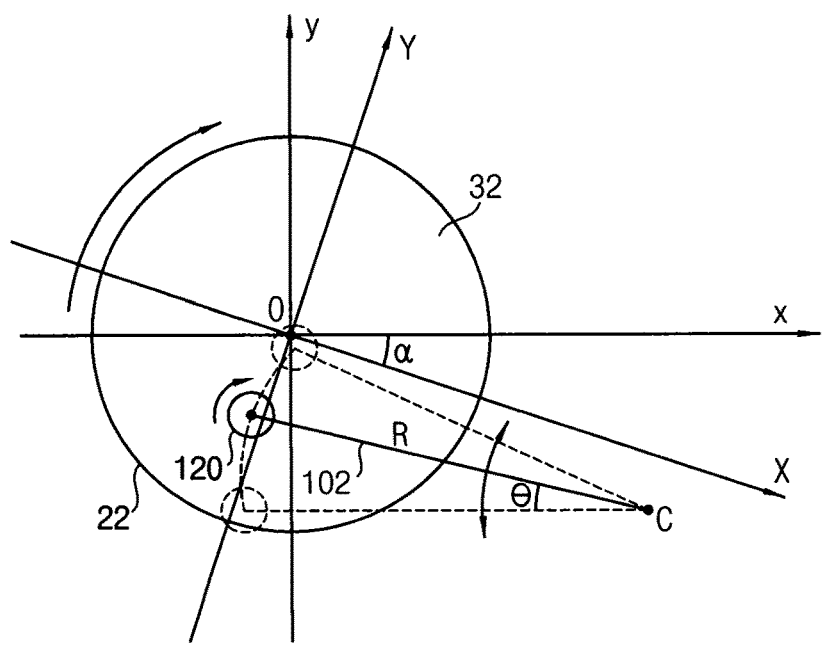
Figure 4:
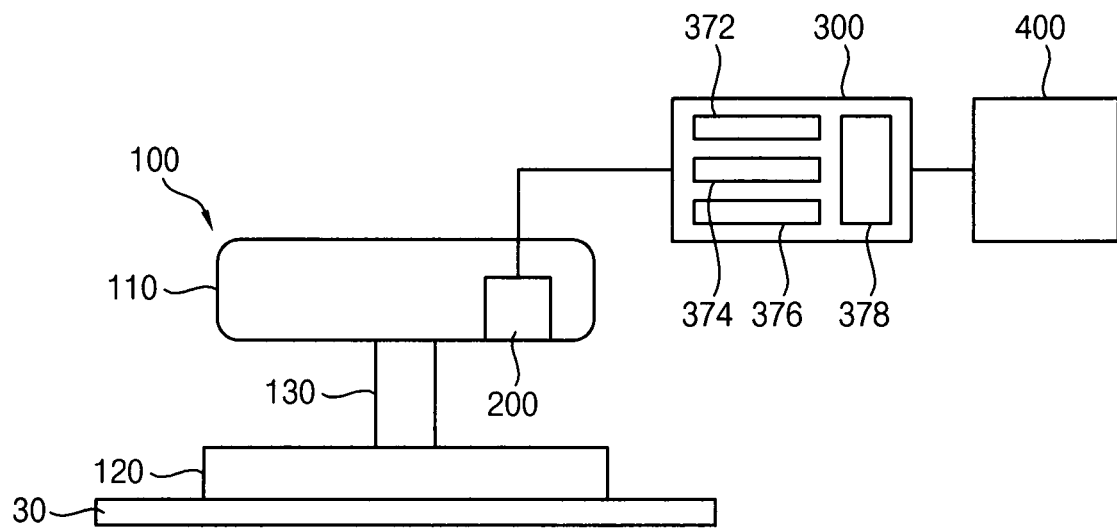
Figure 5:
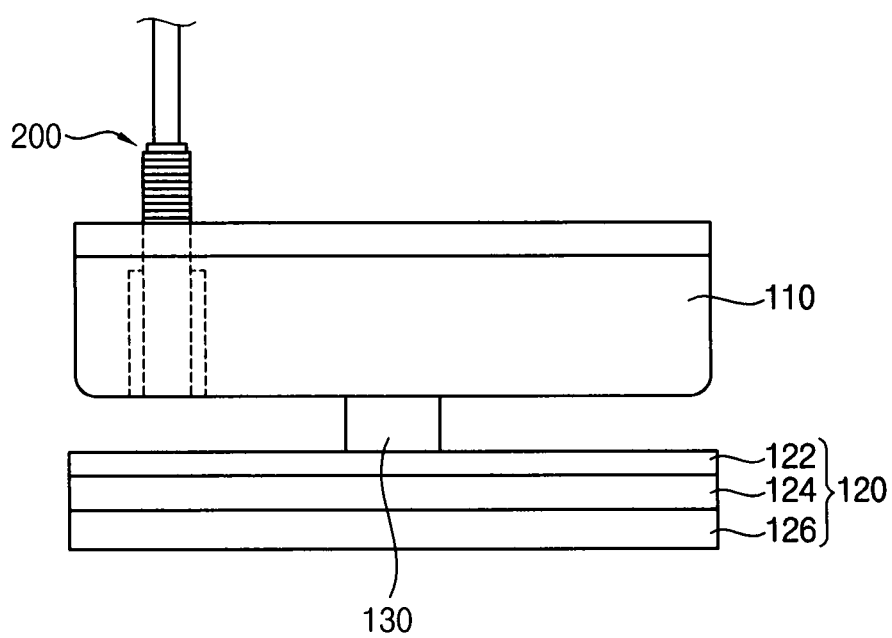
Figure 6:
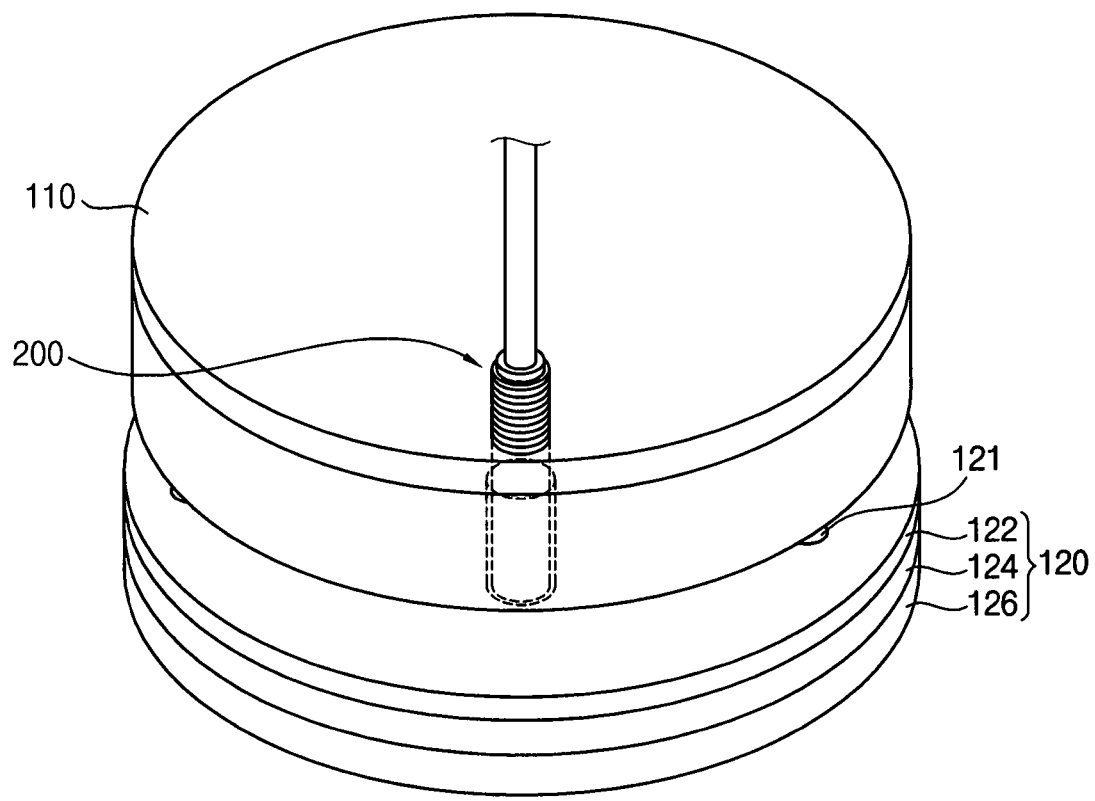
Figure 7:
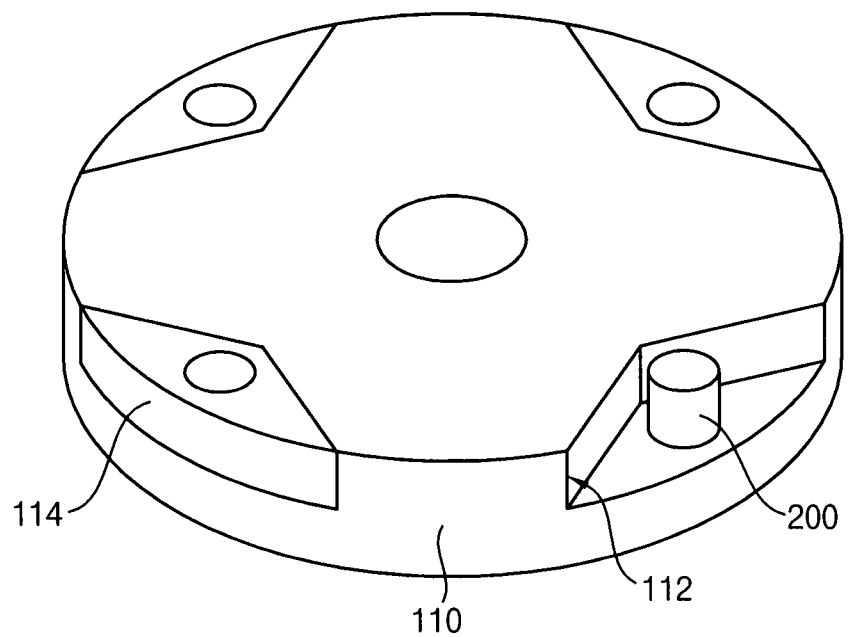
Figure 8:
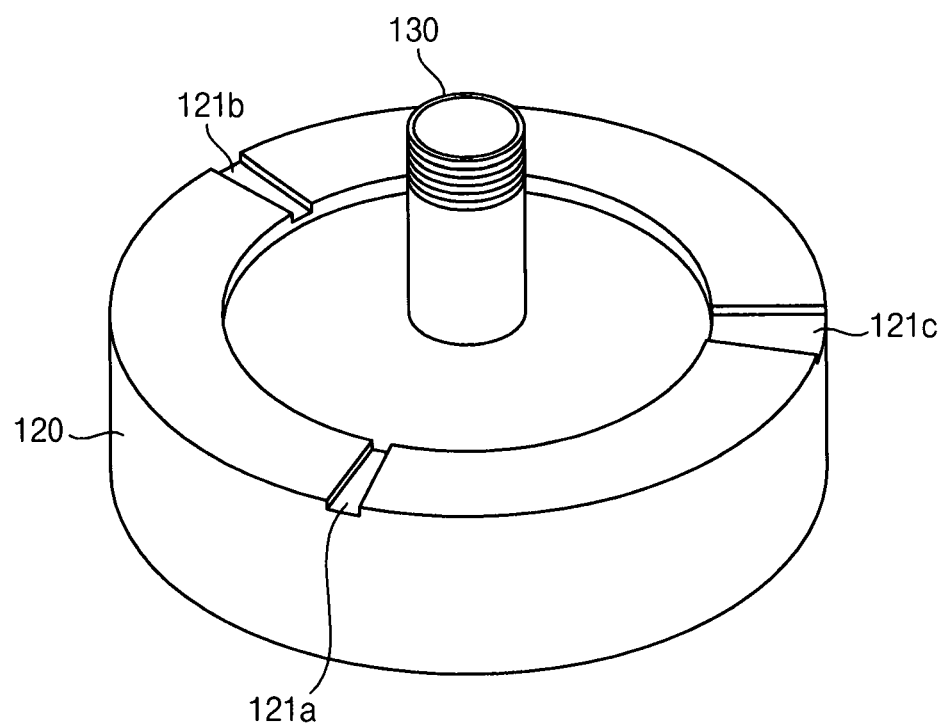
Figure 9:
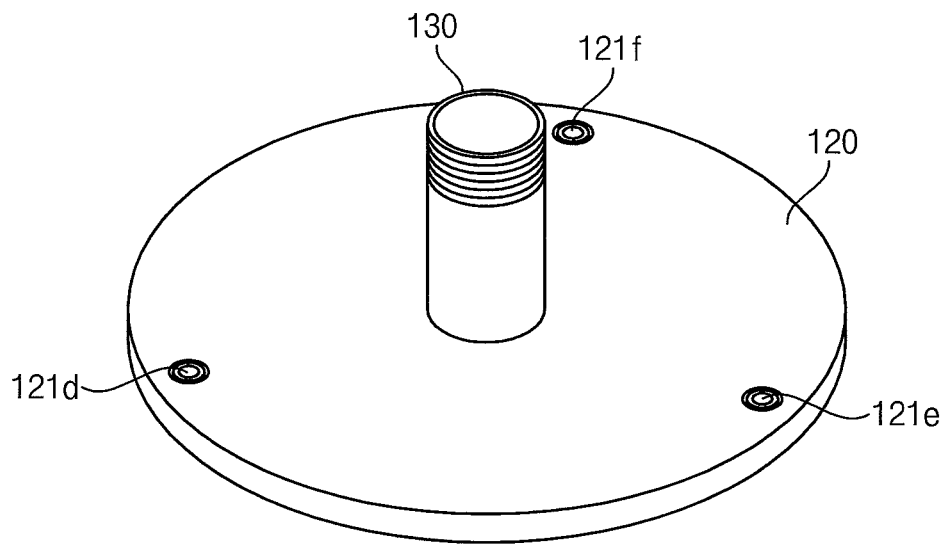
Figure 10:
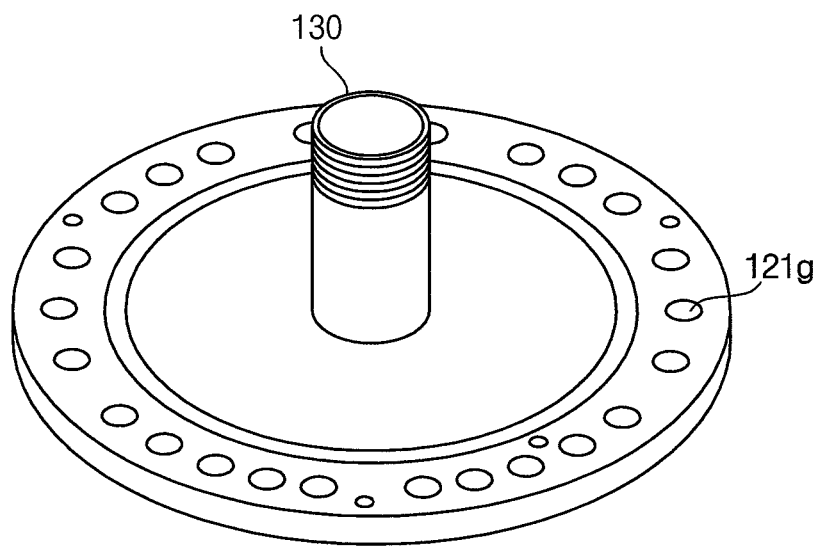

FIG. 1 is a perspective view illustrating a chemical mechanical polishing apparatus in accordance with example embodiments. FIG. 2 is a perspective view illustrating a polishing pad of the chemical mechanical polishing apparatus in FIG. 1. FIG. 3 is a plan view illustrating a relative position between the polishing pad and a polishing pad conditioner of the chemical mechanical polishing apparatus in FIG. 1. FIG. 4 is a block diagram illustrating a monitoring apparatus of the polishing pad in FIG. 2. FIG. 5 is a side view illustrating the polishing pad conditioner and an eddy current sensor in FIG. 4. FIG. 6 is a perspective view illustrating the polishing pad conditioner and the eddy current sensor in FIG. 4. FIG. 7 is a perspective view illustrating the eddy current sensors installed in a disk head of the polishing pad conditioner in FIG. 6. FIGS. 8 to 10 are perspective views in which indexing structures are provided in an upper surface of a disk of the polishing pad conditioner in accordance with example embodiments.

Referring to FIGS. 1 to 10, a chemical mechanical polishing (CMP) apparatus 10 may include a polishing table 20 having a polishing pad 30 thereon, a polishing carrier apparatus 40 having a polishing head 42 for holding a substrate such as a wafer W, a slurry dispenser 50 configured to dispense a slurry onto the polishing pad 30 to be used for a chemical mechanical polishing process, a polishing pad conditioner 100 configured to condition a polishing surface 32 of the polishing pad 30, and a polishing pad monitoring apparatus/device configured to monitor the polishing pad conditioner 100 so as to maintain a polishing performance of the polishing pad 30.

The wafer may refer to a substrate formed of a semiconductor or non-semiconductor material. The wafer may include one or more layers formed on the substrate. For example, such layers may include, but are not limited to, a resist, a dielectric material or a conductive material. For example, the wafer may include portions to be diced into a plurality of dies, each having a repeatable pattern features.

The polishing table 20 may be rotatable and may have a disk shape on which the polishing pad 30 is positioned. The polishing table 20 may be operable to rotate about its own axis 23. The polishing table 20 may rotate the polishing pad 30 at a desired speed in order to polish the substrate such as the wafer. For example, the CMP apparatus may include a motor (not illustrated) that may rotate a driving shaft 22 connected to the polishing table 20 thereby rotating the polishing table 20.

The polishing pad 30 may include abrasive particles formed thereon to polish the substrate. The polishing pad 30 may include an elastomeric material having a rough surface such as polyurethane. The polishing pad 30 may also be rotated by the polishing table 20.

The polishing head 42 may hold the substrate and press the substrate down for a surface of the substrate to be in contact with the polishing pad 30 and to be polished against the polishing pad 30. The polishing head 42 may be connected to and combined with a drive shaft of the polishing carrier apparatus 40 to move on the polishing pad 30 while rotating. The polishing head 42 may include a retainer ring and may hold the substrate such as the wafer W under a flexible membrane.

The slurry dispenser 50 may dispense the slurry onto the polishing pad 30 through a slurry dispensing nozzle. The slurry may be used to perform the chemical mechanical polishing process. The slurry may be used to chemically and/or mechanically planarize the wafer.

The polishing head 42 and the polishing table 20 may rotate in respective directions as illustrated by arrows in FIG. 1. In this state, the polishing head 42 may hold and pressurize the wafer W against the polishing pad 30, and the slurry dispenser 50 may supply the slurry as a polishing material onto the polishing pad 30. For example, the slurry may be a watery mixture of an insoluble matter. For example, the slurry may be a mixture of a liquid and a solid power. The wafer W and the polishing pad 30 may be brought into sliding contact with each other in the presence of the polishing material, whereby a surface of the wafer W is polished. For example, the wafer W and the polishing pad 30 may contact each other and may slide against each other. The slurry may be sandwiched between the wafer W and the polishing pad 30 while the wafer W and the polishing pad 30 slide against each other.

When the polishing pad 30 is worn by friction between the polishing pad 30 and the wafer, the polishing pad conditioner 100 may be provided to reduce the abrasion of the polishing pad 30. The pad conditioner 100 may regenerate the rough surface of the polishing pad 30 to maintain acceptable and consistent removal rates. A conditioner disk 120 of the polishing pad conditioner 100 may be brought into sliding contact with the polishing surface 32 of the polishing pad 30. For example, the conditioner disk 120 may be in contact with the polishing surface 32, and the conditioner disk 120 may slide against the polishing surface 32 of the polishing pad 30 while the pad conditioner 100 regenerates the rough surface of the polishing pad 30. Accordingly, the polishing pad 30 may be used for an extended time without being replaced.

The CMP apparatus may include elements substantially the same as or similar to a conventional CMP apparatus except for the polishing pad conditioner and the polishing pad monitoring apparatus. Hereinafter, the polishing pad conditioner and the polishing pad monitoring apparatus will be explained in detail.

In example embodiments, the polishing pad conditioner 100 may perform a conditioning process on the polishing surface 32 of the polishing pad 30, and the polishing pad monitoring apparatus may monitor the polishing pad conditioner 100 to diagnose an abrasion amount and an abrasion state of the polishing pad 30 and a failure of the polishing pad conditioner 100.

The polishing pad conditioner 100 may include the conditioner disk 120 to be brought into sliding contact (e.g., contact and slide) with the polishing surface 32 of the polishing pad 30 and a disk head 110 to rotatably support a disk shaft 130 connected to the conditioner disk 120. For example, the disk head 110 may be connected on one end of the disk shaft 130 and the conditioner disk 120 may be connected to the other end of the disk shaft 130. The polishing pad conditioner 100 may include a conditioner arm support shaft 104 and a conditioner arm 102 rotating about the central axis of the conditioner arm support shaft 104. The disk head 110 may be installed in a distal end portion of the conditioner arm 102. For example, the conditioner arm support shaft 104 may be connected on one end of the conditioner arm 102 and the disk head 110 may be connected on the other end of the conditioner arm 102.

The disk shaft 130 may be rotated by a motor (not illustrated) installed/disposed in the disk head 110 or the conditioner arm 102. The conditioner disk 120 secured to the disk shaft 130 may be rotated by the rotation of the disk shaft 130.

The disk head 110 or the conditioner arm 102 may include a pneumatic cylinder (not illustrated) for elevating the disk shaft 130. The pneumatic cylinder may be an actuator for enabling the conditioner disk 120 to exert a load on the polishing pad 30. The load may be regulated by a pneumatic pressure supplied to the pneumatic cylinder. The pneumatic cylinder may press the conditioner disk 120 through the disk shaft 130 against the polishing surface 32 of the polishing pad 30 with a predetermined load.

The conditioner disk 120 may include a disk cover 122, a disk body 124 and a lower disk 126. The lower disk 126 may have a lower surface to which diamond particles are fixed. The disk body 124 may be connected to the disk shaft 130 to rotate therewith. The disk cover 122 may include indexing structures which are arranged at equal angle interval about a disk center, as described later.

The disk head 110 may have a shape corresponding to the conditioner disk 120. A size of the disk head 110 may be substantially the same as or less than a size of the conditioner disk 120. For example, the disk head 110 may have a diameter the same as or less than the diameter of the conditioner disk 120 in a plan view. For example, the disk head 110 may have a diameter of about 50 mm to about 200 mm. The disk head 110 and the conditioner disk 120 may include a metal material such as aluminum, stainless steel, etc.

The conditioning process of the polishing surface 32 of the polishing pad 30 may be performed as follows. The polishing table 20 and the polishing pad 30 may be rotated by the rotation of the driving shaft 22. In this state, a dressing liquid may be supplied onto the polishing surface 32 of the polishing pad 30. For example, the dressing liquid may be deionized water or a chemical liquid. The conditioner disk 120 may rotate about its own axis. The conditioner disk 120 may be pressed against the polishing surface 32 by the pneumatic cylinder to bring a lower surface of the conditioner disk 120 into sliding contact with the polishing surface 32. The conditioner arm 102 may swing over the polishing pad 30 for the conditioner disk 120 to move (swing) on the polishing pad 30 in a substantially radial direction of the polishing pad 30. For example, the conditioner disk 120 may move on the polishing pad 30 from the center of the polishing pad 30 toward an edge of the polishing pad 30 while the polishing pad 30 is rotating along with the polishing table 20. In certain embodiments, the conditioner disk 120 may also move on the polishing pad 30 from an edge of the polishing pad 30 toward the center of the polishing pad 30 while the polishing pad 30 is rotating along with the polishing table 20. The rotating conditioner disk 120 may regenerate the polishing surface 32 of the polishing pad 30 to provide an even polishing surface. For example, the rotating conditioner disk 120 may condition the polishing surface 32 of the polishing pad 30 to be flat, thereby allowing for the polishing pad 30 to be reused to polish wafers.

The chemical mechanical polishing apparatus may include a table rotary encoder to detect a rotation angle of the polishing table 20 and the polishing pad 30 and a conditioner arm rotary encoder to detect a swing angle of the conditioner arm 102. For example, the rotary encoders may be on-axis magnetic encoders, off-axis magnetic encoders or optical encoders.

As illustrated in FIG. 3, x-y coordinate system is a stationary coordinate system defined on a base of the polishing apparatus and X-Y coordinate system is a rotating coordinate system defined on the polishing surface 32 of the polishing pad 30. The polishing pad 30 may rotate about an origin O of the x-y coordinate system, while the conditioner disk 120 may swing at a predetermined angle about a predetermined point C on the x-y coordinate system. The position of the point C may correspond to a central axis position of the conditioner arm support shaft 104 in FIG. 1.

Coordinates of the center of the conditioner disk 120 on the x-y stationary coordinate system may be determined from coordinates of the point C, a distance R and an angle Θ. Coordinates of the center of the condition disk 120 on the X-Y rotating coordinate system may be determined from the coordinates of the center of the conditioner disk 120 on the x-y stationary coordinate system and a rotation angle α of the polishing pad 30. Conversion of the coordinates on the stationary coordinate system into the coordinates on the rotating coordinate system may be carried out by using known trigonometric functions and four arithmetic operations.

The X-Y rotating coordinate system may be a two-dimensional surface defined on the polishing surface 32. For example, the coordinates of the conditioner disk 120 on the X-Y rotating coordinate system may indicate a relative position of the conditioner disk 120 with respect to the polishing surface 32. In this manner, the position of the conditioner disk 120 may be expressed as the position on the two-dimensional surface defined on the polishing surface 32.

The polishing pad monitoring apparatus may include a non-contacting sensor such as an eddy current sensor 200 and a data processor 300. The non-contact sensor may detect a displacement of the conditioner disk 120. The polishing pad monitoring apparatus may further include a controller 400 for controlling operations of the conditioner disk 120 according to results calculated in the data processor 300.

The non-contacting sensor such as the eddy current sensor 200 may be installed to face the upper surface of the conditioner disk 120, to detect the displacement of the conditioner disk 120. For example, the non-contacting sensor may detect a distance of the conditioner disk 120 from the non-contacting sensor. For example, the non-contacting sensor may detect a deviation from a predetermined position of the conditioner disk 120. For example, the non-contacting sensor may include an eddy current sensor 200. The eddy current sensor 200 may detect a height of the upper surface of the conditioner disk 120 which is rotating while contacting the polishing surface 32 of the polishing pad 30. The eddy current sensor 200 may transmit an output signal (e.g., the height value of the conditioner disk 120) to the data processor 300 each time the eddy current sensor 200 detects the height of the upper surface of the conditioner disk 120.

As illustrated in FIG. 7, one or more eddy current sensors 200 may be installed in the disk head 110. For example, four eddy current sensors 200 may be installed at equal angle interval about the center of the disk head 110 to be spaced apart from each other. The conditioner disk 120 may have a gimbal structure. When the conditioner disk 120 having a gimbal structure swings or rotates, a plurality of the eddy current sensors 200 may be provided to precisely detect position information of the conditioner disk 120. For example, the position of the disk may be detected by obtaining the position of lines or a surface from the sensing values of a plurality of the eddy current sensors 200. The eddy current sensor 200 may be installed in a lower surface of the disk head 110. The eddy current sensor 200 may be installed in a seating portion 112 such as a slot or a recess formed in the lower surface of the disk head 110. A cover member 114 may cover the eddy current sensor 200 to protect from the surrounding environment. For example, the cover member 114 may be a cover made of a metal or a ceramic.

Alternatively, when the size of the disk head 110 is less than the size of the conditioner disk 120, the eddy current sensor 200 may be installed in a lower surface of the conditioner arm 102 outside the disk head 110 to face the upper surface of the conditioner disk 120.

As illustrated in FIGS. 8 to 10, the conditioner disk 120 may include the indexing structures 121a-121g which may be arranged at equal angle interval about a disk center in the upper surface thereof. Indexing structure(s) 121 may collectively represent indexing structures 121a through 121g, or an arbitrary one of the indexing structures 121a-121g throughout the present disclosure including the drawings. As described later, the indexing structures may be used to calculate a rotational speed (rpm) and a rotational angular displacement of the conditioner disk 120 and to provide singular points for converting into a two-dimensional plane profile having a constant height during a rotation period of the condition disk 120. For example, the sensor may be configured to detect distances and/or positions of portions of the conditioner disk 120 on the basis of the positions of the indexing structures.

The conditioner disk 120 in FIG. 8 may include first, second and third indexing grooves 121a, 121b, and 121c. The first to third indexing grooves 121a, 121b, and 121c may be arranged at equal angle interval (for example, 120 degrees). The first indexing groove 121a may have a first width, the second indexing groove 121b may have a second width greater than the first width, and the third indexing groove 121c may have a third width greater than the second width.

The conditioner disk 120 in FIG. 9 may include first, second and third indexing conductors 121d, 121e, and 121f. The first to third indexing conductors 121d, 121e, and 121f may include a conductive material such as a metal pattern, bolt, etc. The first indexing conductor 121d may have a first size, the second indexing conductor 121e may have a second size greater than the first size, and the third indexing conductor 121f may have a third size greater than the second size.

The conditioner disk 120 in FIG. 10 may include a plurality of indexing magnetic bodies 121g. The indexing magnetic bodies may be arranged along a circumferential direction about the center of the conditioner disk 120. A distance between the indexing magnetic bodies 121g or magnetic forces of the indexing magnetic bodies 121g may be changed to provide singular points according to the angle position.

In example embodiments, as illustrated in FIG. 4, the data processor 300 may convert an analog output signal from the eddy current sensor 200 into two-dimensional plane profile on the upper surface of the conditioner disk 120 and determine a height of the polishing pad 20 and a failure of the polishing pad conditioner 100 from the converted two-dimensional plane profile. The data processor 300 may include a data receiver 372, a data converter 374, a calculator 376 and a storage portion 378.

The data receiver 372 may receive the analog output signal from the eddy current sensor 200. The data receiver 372 may receive detection values of the rotation angle α and the swing angle Θ from the table rotary encoder and the conditioner arm rotary encoder.

The data converter 374 may convert the output signal from the eddy current sensor 200 into two-dimensional plane profile data of a constant height by using a first calibration map. The data converter 374 may convert (match) the output value (e.g., voltage signal) of the eddy current sensor 200 into height data of two-dimensional plane by a second calibration map. The storage portion 378 may store the first and second calibration maps. As described later, the first and second calibration maps may be obtained by using a calibration jig.

The calculator 376 may calculate the height of the conditioner disk 120 based on the converted two-dimensional plane data and the height data and determine a height of the polishing pad 30. The calculator 376 may calculate positions of detection points on the polishing pad 30 to generate a height distribution of the polishing pad 30. The calculator 376 may determine a failure of parts of the polishing pad conditioner 100 and whether the part should be replaced or not.

The controller 400 may control to terminate a conditioning operation on the polishing pad 30 according to the height of the polishing pad 30 or the failure of the polishing pad conditioner 100 determined in the data processor 300. The data processor 300, controller 400, data receiver 372, data converter 374, and calculator 376 may be implemented with dedicated hardware, software, and circuitry configured to perform the functions described herein. These elements may be physically implemented by electronic (or optical) circuits such as logic circuits, discrete components, microprocessors, hard-wired circuits, memory elements, wiring connections, and the like.

Hereinafter, a method of calibrating the output signal from the eddy current sensor will be explained.

Figure 11:
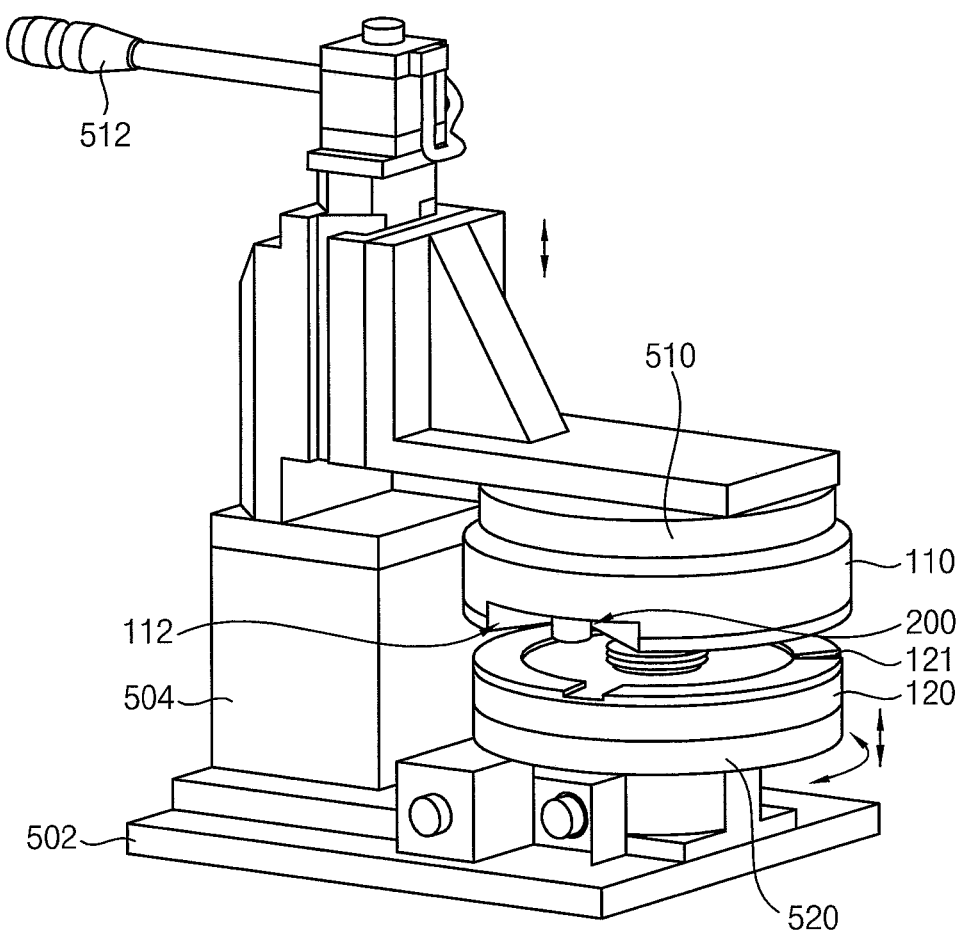
Figure 12:
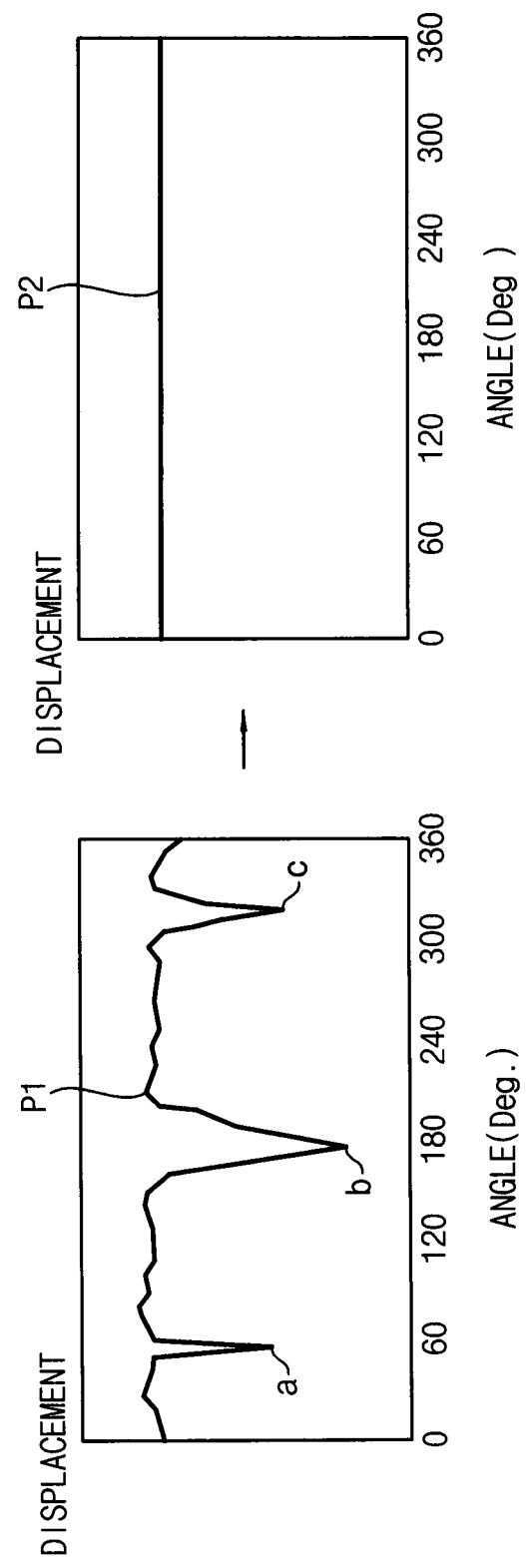
Figure 13:
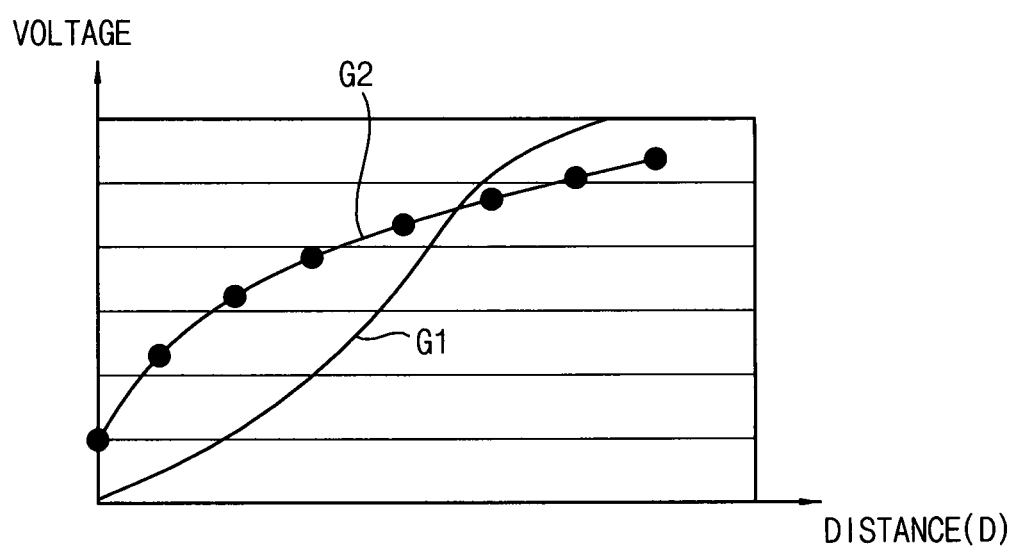

FIG. 11 is a perspective view illustrating a calibration jig used for data conversion in a polishing pad monitoring apparatus in accordance with example embodiments. FIG. 12 is a graph illustrating a first calibration map for converting analog output data into two-dimensional plane profile data of a constant height by using the calibration jig in FIG. 11. FIG. 13 is a second calibration map for converting analog output data into height data of two-dimensional plane by using the calibration jig in FIG. 11.

Referring to FIG. 11, a calibration jig 500 may include a base 502, a column 504, a first support 510 and a second support 520. The column 504 may extend in a vertical direction on the base 502. The first support 510 may extend in a horizontal direction from the column 504 to face the second support 520. The second support 520 may be disposed on the base 502 to face the first support 510.

The first support 510 may support fixedly a disk head 110 on a lower surface thereof. The second support 520 may support rotatably a conditioner disk 120 on an upper surface thereof. A relative vertical distance between the first support 510 and the second support 520 may be adjusted to be changed. For example, the second support 520 may be installed on the base 502 to be movable upwardly and downwardly in the vertical direction. Alternatively, the first support 510 may be installed to be movable upwardly and downwardly in the vertical direction along the column 504.

An eddy current sensor 200 as a displacement sensor may be installed in a disk head 110 of a polishing pad conditioner 100 to detect a displacement of a conditioner disk 120. Indexing structures 121 may be provided in an upper surface of the conditioner disk 120. After the disk head 110 is secured to the lower surface of the first support 510 and the conditioner disk 120 is secured to the upper surface of the second support 520, while rotating the conditioner disk 120 and changing a distance between the disk head 110 and the conditioner disk 120, a calibration map for converting analog voltage signal data from the eddy current sensor 200 may be obtained. For example, the calibration map may represent reference values indicating respective distances of portions of the conditioner disk 120 with respect to the eddy current sensor 200, and the polishing pad 30 may be examined on the basis of the reference values when the polishing pad conditioner 100 performs the conditioning process of the polishing pad 30.

Referring to FIG. 12, a displacement value detected by the eddy current sensor 200 may form a waveform P1 according to a rotation angle of the conditioner disk 120. The upper surface of the conditioner disk 120 may not be even and there may be a conductor such as a bolt in the upper surface. During one revolution of the conditioner disk 120, singular points (e.g., a, b, and c) may be provided by indexing structures 121 to appear in the waveform. The singular points may provide a rotational speed (rpm) and a rotational angular displacement of the conditioner disk 120 and a displacement deviation value (e.g., offset value).

Since the eddy current sensor 200 is influenced by a shape of the conditioner disk 120 and a magnetic field, a plane profile of waveform (P1) may be offset compensated by reflecting the displacement deviation value of the singular points to obtain a two-dimensional plane profile (P2) of a constant displacement value, e.g., a constant height. A correlation between the plane profile of waveform (P1) and the two-dimensional plane profile (P2) may be stored as the first calibration map in the storage portion 378. Accordingly, disturbances due to the surface of the conditioner disk, the shape of the conductor, the magnetic field, etc. may be reduced or removed from the output signal of the eddy current sensor 200 to obtain a constant displacement value. For example, raw data (as represented by graph P1 of FIG. 12) detected by the eddy current sensor 200 may be compensated to eliminate influences of singular points and other influences thereby forming the first calibration map so that the first calibration map has a flat plane reference as represented by graph P2 of FIG. 12.

Referring to FIG. 13, while changing a relative distance between the first support 510 and the second support 520, analog output values (e.g., voltage values) of the eddy current sensor 200 to obtain a correlation between the sensing values (e.g., voltage values) of the eddy current sensor 200 and the relative distance D. The correlation may be stored as the second calibration map in the storage portion 378.

Since the eddy current sensor 200 is installed in the disk head 110 that is a conductor, the eddy current sensor 200 may be interfered by a surrounding conductor material. For example, because the disk head 110 is a conductor, the disk head 110 may affect a signal detected by the eddy current sensor 200. Graph G1 may represent a correlation between the voltage signal outputting from the eddy current sensor 200 and the relative distance without the surrounding conductor material, and graph G2 may represent a correlation (e.g., second calibration map) between the voltage signal outputting from the eddy current sensor 200 and the relative distance when the detected signal is affected by the surrounding conductor material when the eddy current sensor 200 is installed in the disk head. Accordingly, the detected voltage value may be matched to a precise distance by reflecting the changes in the voltage signal due to the interference, thereby calculating a precise height of the conditioner disk 120. For example, by compensating the influence of the ambient conductive material, more precise distances may be obtained. For example, by producing and applying the second calibration map (e.g., graph G2 of FIG. 13) in measuring a distance, a more precise distance of an object from the eddy current sensor 200 may be obtained.

Hereinafter, a method of monitoring a polishing pad during a conditioning process performed on a polishing pad using the polishing pad monitoring apparatus will be explained.

Figure 14:
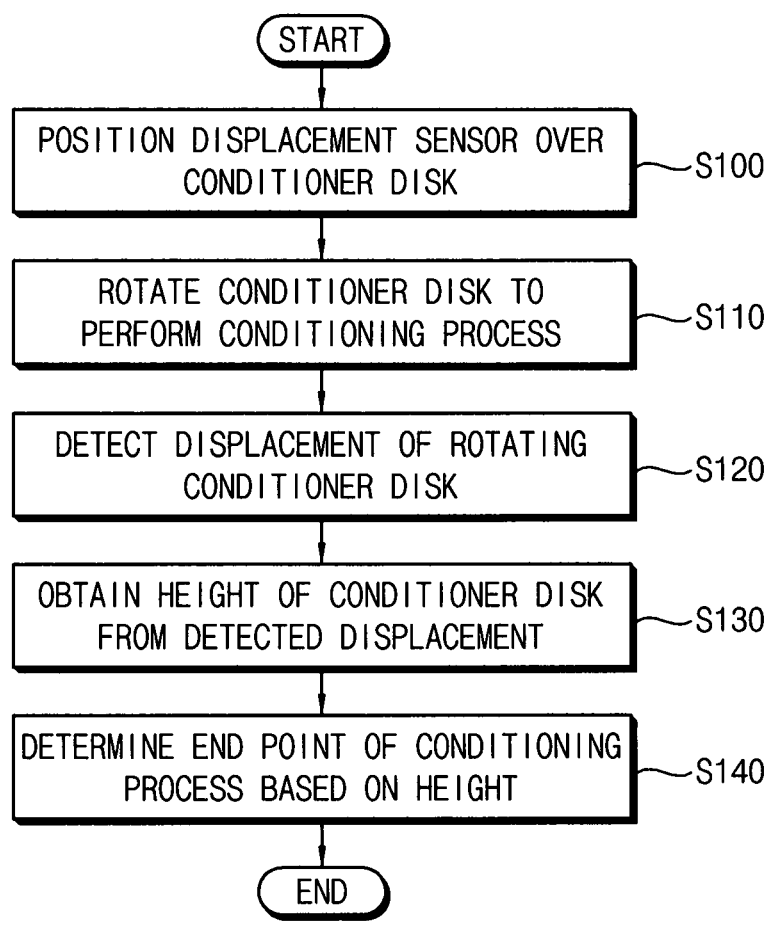

FIG. 14 is a flow chart illustrating a polishing pad monitoring method in accordance with example embodiments.

Referring to FIGS. 1, 4, 7 and 14, a displacement sensor such as an eddy current sensor 200 may be positioned over a conditioner disk 120 (S100).

In example embodiments, the displacement sensor such as the eddy current sensor 200 may be installed in a disk head 100 which is configured to rotate a disk shaft 130 connected to the conditioner disk 120.

The displacement sensor is not limited to the eddy current sensor 200. For example, the displacement sensor may include a non-contacting sensor or another displacement sensor. The non-contacting sensor is not limited to the eddy current sensor 200. For example, the non-contacting sensor may include an eddy current sensor 200 or another non-contacting sensor. The eddy current sensor 200 may be installed in a lower surface of the disk head 110. A plurality of the eddy current sensors 200 may be installed at equal angle interval along a circumferential direction of the disk head 110 to be spaced apart from each other.

The conditioner disk 120 may include indexing structures 121 which are arranged at equal angle interval about a disk center in the upper surface of the conditioner disk 120.

Then, the conditioner disk 120 may be rotated to perform a conditioning process on a polishing surface 32 of a polishing pad 30 (S110), a displacement of the rotating conditioner disk 120 may be detected by using the displacement sensor such as the eddy current sensor 200 during the conditioning process on the polishing surface 32 (S120), and then a height of the conditioner disk 120 may be calculated from the detected displacement (S130).

A conditioner arm 102 may swing to move the conditioner disk 120 over the polishing pad 30, the conditioner disk 120 may be rotated and the conditioner disk 120 may be pressed against the polishing surface 32 of the polishing pad 30 with a predetermined load. The eddy current sensor 200 may transmit a voltage signal to a data processor 300 each time the eddy current sensor 200 detects a height of the upper surface of the rotating conditioner disk 120.

A displacement value detected by the eddy current sensor 200 may form a waveform with respect to a rotation angle of the conditioner disk 120. During one revolution of the conditioner disk 120, singular points (a, b, c) may appear in the waveform by indexing structures 121.

A data converter 374 may offset compensate a plane profile of waveform (P1) by reflecting displacement deviation values of the singular points by using a first calibration map (see FIG. 12) to obtain a two-dimensional plane profile (P2) of a constant displacement value, e.g., a constant height. A calculator 376 may calculate a height (e.g., displacement) of the conditioner disk 120 during one revolution of the conditioner disk 120 based on the two-dimensional plane profile (P2).

A data converter 374 may convert (e.g., match) the output value (e.g., voltage signal) of the eddy current sensor 200 into height data of two-dimensional plane by using a second calibration map (see FIG. 13).

Then, an end point of the conditioning process on the polishing surface 32 may be determined based on the calculated height (e.g., distance) (S140).

The data processor 300 may calculate a change in a height of the polishing pad 30, a change in a rotational speed (rpm) of the conditioner disk 120, a change in a swing speed of the conditioner arm 102, a change in a displacement of the conditioner disk 120 during the swing operation of the conditioner arm 102, etc.

The end point of the conditioning process may be determined based on the height of the polishing pad 30. A change in a pressure of the conditioner disk 120 against the polishing pad 32 may be determined from the change in the height of the polishing pad 30. A failure and replacement time of parts in the polishing pad conditioner 100 may be determined based on the change in the rotational speed (rpm) of the conditioner disk 120, the change in the swing speed of the conditioner arm 102, the change in the displacement of the conditioner disk 120 during the swing operation of the conditioner arm 102.

A controller 400 may output analysis result/data to a polishing apparatus 10 and/or may control operations of the polishing apparatus 10.

As mentioned above, in the polishing pad monitoring method, a movement (displacement) of the rotating conditioner disk 120 may be detected by using the eddy current sensor 200 installed in the disk head 110, and the height of the polishing pad 30 and the failure and replacement time of the parts in the polishing pad conditioner 100 may be determined.

Accordingly, since a precise profile of the polishing pad 30 is obtained during the conditioning process, the polishing pad conditioning process may be analyzed precisely, and fault diagnosis for movement balance (sweep, rotation) maintenance of the conditioner disk 120 may be performed easily. For example, a problem with the conditioner disk 120 and/or the polishing pad 30 may be easily detected by the polishing pad monitoring method so that troubleshooting may be promptly performed.

The above polishing pad monitoring method and apparatus may be applied to a CMP process. Semiconductor devices such as DRAM, VNAND, etc. manufactured by using the CMP process may be used for various systems such as a computing system. The system may be applied to computer, portable computer, laptop computer, PDA, tablet, mobile phone, digital music player, etc. For example, the CMP process may be applied on a substrate such as a semiconductor wafer to form a conductor pattern or an insulator pattern on the substrate. The substrate may be diced into a plurality of chips, and each of the chips may be packaged to form a semiconductor device such as a DRAM, a VNAND, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:
1. A polishing apparatus, comprising:
   a polishing pad conditioner including a conditioner disk which is rotatable and configured to condition a polishing surface of a polishing pad;
   a non-contacting displacement sensor arranged to face an upper surface of the conditioner disk and configured to detect a displacement of the conditioner disk while the conditioner disk rotates; and
   a data processor configured to calculate a height of the conditioner disk from displacement detected by the non-contacting displacement sensor and configured to determine a height of the polishing pad or a failure of the polishing pad conditioner including the conditioner disk,
   wherein the polishing pad conditioner includes a disk head which is configured to rotate a disk shaft connected to the conditioner disk and the non-contacting displacement sensor is installed in the disk head, and
   wherein the non-contacting displacement sensor is one of a plurality of non-contacting displacement sensors installed at equal angle intervals along a circumferential direction of the disk head to be spaced apart from each other.

2. The polishing apparatus of claim 1, wherein the non-contacting displacement sensor comprises an eddy current sensor.

3. The polishing apparatus of claim 2, wherein the data processor comprises:
   a data receiver configured to receive an output signal from the eddy current sensor;
   a data converter configured to convert the output signal into two-dimensional plane profile data of a constant displacement and to convert the output signal into height data of a two-dimensional plane; and
   a calculator configured to calculate the height of the conditioner disk based on the two-dimensional plane profile data and the height data.

4. The polishing apparatus of claim 3, wherein the data converter is configured to perform an offset compensation to convert data of voltage signals into the two-dimensional plane profile data using singular points obtained from indexing structures on the upper surface of the conditioner disk.

5. The polishing apparatus of claim 3, wherein the data converter is configured to convert the output signal into the height of the conditioner disk using a calibration map between the output signal and the height.

6. The polishing apparatus of claim 3, wherein the calculator is configured to determine the height of the polishing pad or the failure of the polishing pad conditioner from the calculated height.

7. The polishing apparatus of claim 1, wherein the non-contacting displacement sensor is installed in a lower surface of the disk head.

8. The polishing apparatus of claim 1, further comprising:
   a controller configured to terminate a conditioning operation on the polishing pad according to the height of the polishing pad or the failure of the polishing pad conditioner.

9. A polishing apparatus, comprising:
   a polishing pad conditioner including a conditioner disk which is rotatable and configured to condition a polishing surface of a polishing pad;

a non-contacting displacement sensor arranged to face an upper surface of the conditioner disk and configured to detect a displacement of the conditioner disk while the conditioner disk rotates; and a data processor configured to calculate a height of the conditioner disk from displacement detected by the non-contacting displacement sensor and configured to determine a height of the polishing pad or a failure of the polishing pad conditioner including the conditioner disk, wherein the non-contacting displacement sensor comprises an eddy current sensor, wherein the data processor comprises:

a data receiver configured to receive an output signal from the eddy current sensor;

a data converter configured to convert the output signal into two-dimensional plane profile data of a constant displacement and to convert the output signal into height data of a two-dimensional plane; and a calculator configured to calculate the height of the conditioner disk based on the two-dimensional plane profile data and the height data, and wherein the data converter is configured to perform an offset compensation to convert data of voltage signals into the two-dimensional plane profile data using singular points obtained from indexing structures on the upper surface of the conditioner disk.

10. The polishing apparatus of claim 9, wherein the polishing pad conditioner includes a disk head which is configured to rotate a disk shaft connected to the conditioner disk and the non-contacting displacement sensor is installed in the disk head.

11. The polishing apparatus of claim 10, wherein the non-contacting displacement sensor is installed in a lower surface of the disk head.

12. The polishing apparatus of claim 10, wherein the non-contacting displacement sensor is one of a plurality of non-contacting displacement sensors installed at equal angle intervals along a circumferential direction of the disk head to be spaced apart from each other.

13. The polishing apparatus of claim 9, wherein the data converter is configured to convert the output signal into the height of the conditioner disk using a calibration map between the output signal and the height.

14. The polishing apparatus of claim 9, wherein the calculator is configured to determine the height of the polishing pad or the failure of the polishing pad conditioner from the calculated height.

15. The polishing apparatus of claim 9, further comprising:

a controller configured to terminate a conditioning operation on the polishing pad according to the height of the polishing pad or the failure of the polishing pad conditioner.

* * * * *